United States Patent [19]

Strohmaier et al.

[11] Patent Number: 5,404,408

[45] Date of Patent: Apr. 4, 1995

[54] MINIATURE HEARING AID TO BE WORN ON THE HEAD, AND A METHOD FOR THE MANUFACTURE THEREOF

[75] Inventors: Harald Strohmaier, Bubenreuth; Joseph Sauer, Strullendorf, both of Germany

[73] Assignee: Siemens Aktiengesellschaft, Munich, Germany

[21] Appl. No.: 235,237

[22] Filed: Apr. 29, 1994

Related U.S. Application Data

[63] Continuation of Ser. No. 872,956, Apr. 23, 1992, abandoned.

[30] Foreign Application Priority Data

Jun. 28, 1991 [DE] Germany ............ 41 21 449.8

[51] Int. Cl.$^6$ ............................. H04R 25/00
[52] U.S. Cl. ...................... 381/68.7; 381/68; 361/760; 29/841
[58] Field of Search ............ 361/807, 808, 809, 810, 361/811, 812, 760, 771, 779, 767, 768, 769, 770; 437/211; 257/700, 723, 724; 381/68, 68.7, 68.6, 69, 69.2; 439/83; 29/841

[56] References Cited

U.S. PATENT DOCUMENTS

| | | | |
|---|---|---|---|
| 4,354,065 | 10/1982 | Buettner | 381/68.7 |
| 4,635,356 | 1/1987 | Ohuchi et al. | 29/841 |
| 4,690,242 | 9/1987 | Mark | 381/205 |
| 4,868,637 | 9/1989 | Clements et al. | 357/72 |
| 4,942,140 | 7/1990 | Ootsuki et al. | 29/841 |

FOREIGN PATENT DOCUMENTS

| | | | |
|---|---|---|---|
| 3505099A1 | 9/1985 | Germany | H04R 25/00 |
| 8426609 | 1/1986 | Germany | |
| 3840190A1 | 5/1990 | Germany | H04R 25/00 |
| 0001878 | 1/1979 | Japan | 29/841 |
| 62-45138 | 2/1987 | Japan | 29/841 |
| 0268286 | 11/1988 | Japan | 439/83 |
| 0044094 | 2/1989 | Japan | |
| 0020032 | 1/1990 | Japan | 29/841 |

OTHER PUBLICATIONS

Technische Rundschau.
Das neue Phonak Super-Front Super-Compression PP-SC und PP-SC-L.
Technisch Rundschau, pp. 50–54 and 56, 1986.
Das neue Phonak Super-Front Super-Compression PP-SC and PP-SC-L, 1983.

*Primary Examiner*—Curtis Kuntz
*Assistant Examiner*—Huyen D. Le
*Attorney, Agent, or Firm*—Hill, Steadman & Simpson

[57] ABSTRACT

A miniature hearing aid to be worn at the head together with a corresponding manufacturing method are particularly proposed, this hearing aid being distinguished by a miniaturized amplifier unit that is simple to manufacture. A highly shrinkable glue and/or a film that can be sucked on by under-pressure, thereby fixes the electrical components against a carrier part and also holds them against the contacting locations under contacting pressure.

26 Claims, 3 Drawing Sheets

MINIATURE HEARING AID TO BE WORN ON THE HEAD, AND A METHOD FOR THE MANUFACTURE THEREOF

This is a continuation of application Ser. No. 07/872,956, filed Apr. 23, 1992, now abandoned.

BACKGROUND OF THE INVENTION

The invention is directed to a hearing aid, particularly a miniature hearing aid to be worn at the head, comprising a housing, sound transducers, an amplifier unit, control elements, a power source, or the like. The invention is also directed to a method for the manufacture of the hearing aid.

For designing the amplifier unit, it is known in hearing aids to arrange electronic electrical components such as, for example, capacitors, resistors, etc at a printed circuit board. The electrical components have electrical terminals for contacting interconnects of the printed circuit board. The contact locations are provided as solder points. What is thereby disadvantageous is that the components to be contacted (component and carrier element) must be solderable. Problems also arise due to the influence of heat. In case of repair, the solder points must be dissolved and must then be renewed. Complicated assembly results, and the implementation of the soldering processes uses space that leads to an enlargement of the printed circuit board (German Utility Model 84 26 609 incorporated herein).

Behind-the-ear hearing aids are also commercially available whose amplifier assemblies are designed as electronic components which comprise envelopes of epoxy resin in module form, carry a contact strip at one side, and have this side contacted to a motherboard via plug-type connections and solder points. The electronic amplifier components thereby form cast-out modules that are accommodated in the hearing aid housing in packet form. As a result of their envelope, these modules are in fact protected against moisture and external influences, but they cannot be repaired, and waste a great deal of space.

It is known in surface mounting with surface-mountable components (SMD technique) to mechanically fix the electrical components in the desired position on the printed circuit board with a gluing process. In a further manufacturing step, these components are then soldered to the printed circuit board or are electrically connected with conductive glue. In the soldering, this manufacturing method has the disadvantages already set forth at the outset and, on the other hand, the gluing process for fixing the component parts requires an additional work step. The contacting with conductive glue requires an exact metering or dosing of the conductive glue, assumes surfaces to be joined that are matched to one another, and requires a curing process.

SUMMARY OF THE INVENTION

An object of the invention is to create a hearing aid, particularly a miniature hearing aid to be worn at the head, of the type initially cited whose amplifier unit is distinguished by a miniaturized design and by a simplified manufacture.

In a hearing aid of the type initially cited, this object is inventively achieved in that the amplifier unit is composed of a carrier part and of electrical components, whereby the components are mechanically pressed against contact points of the carrier part such that a highly shrinkable glue provided between the components and the carrier part holds the components against the contact locations with a pressing force.

In a method for manufacturing the hearing aid of the invention, a housing is provided having a sound transducer, an amplifier unit, control elements, and a power source therein. The amplifier unit is formed of a carrier part such as a pc board, for example, and of electrical components on the carrier part. The components are mechanically pressed against contact locations on the carrier part by a highly shrinkable glue provided between the components and the carrier part so as to cause a pressing force which presses the component against the respective contacting location. Alternatively, a film is provided arranged over the component and also at least a portion of the carrier part so as to press the component against the carrier part and consequently against the contact location with which the carrier part is to make contact.

The highly shrinkable glue can be advantageously applied to the carrier part without any special structure and without greater demands being made of the press-on technique, for example by spraying, painting or by immersing the carrier part into a glue bath. The electrical components can be placed against the contact locations of the carrier part thereafter. The equipping can be very advantageously implemented by an automatic machine. The curing/shrinking of the glue only requires a short time and does not require any additional thermal treatment. The known disadvantages involved with a thermal treatment are thereby avoided. On the other hand, the curing time can be shortened in a simple way by ultraviolet irradiation.

In a further development, a coat of insulating material can be applied on the carrier part that is equipped with the components and contacted. The embodiment of the invention is particularly distinguished by a simple and rational manufacture, whereby corrections at the hearing aid can be relatively easily implemented during assembly, as can be repairs. The connections of the components to the carrier part are free of mechanical stresses. Moreover, arbitrary contact partners can be connected, so that a specific selection and pairing of materials is superfluous.

Since the electrical components are not exposed to any heat stress due to manual soldering, or for example flow or reflow soldering in the invention, fewer components are damaged during equipping and components that are more economical because they are less temperature-resistant can be employed.

A further inventive solution of the object in a hearing aid of the type initially cited is distinguished in that the amplifier unit is composed of a carrier part and of electrical components, whereby the components are mechanically pressed against contact locations of the carrier part such that a film, a film tube, a film tube section or the like is arranged over the carrier part equipped with the components and presses the components against the contact locations and fixes them in position. In a corresponding manufacturing method, a film, a film tube, or a film tube section is placed over the carrier part equipped with the components and is pulled against the carrier part by applying an under pressure so that the film or the film tube fixes the components at the provided contacting locations and holds them against the contacting locations with the desired contacting pressure.

According to this embodiment of the invention, the film or the like simultaneously assumes the fixing of the components vis-a-vis the contact locations, maintains the pressing power required for the contacting, and forms a shielding against external influences. A coating lacquer can thereby be superfluous because the film forms a protective cladding against corrosion and moisture. Moreover, the film forms an insulating protection against electrical arc-overs between chip component part contacts.

Since no solder is required in the inventive embodiments using shrinkable glue or using film, the Cu pads of the chips or electrical components can be designed extremely small, this benefiting greater compactness of the amplifier unit. Low-volume insert parts are of particular significance because of the limited installation space in miniature hearing aids such as in-the-ear hearing aids that are worn in the auditory canal of the hearing-impaired person. On the other hand, it is also desirable to make the housing of hearing aids to be worn behind the ear (BTE hearing aids) as small and inconspicuous as possible.

BRIEF DESCRIPTION OF THE DRAWINGS

In an enlarged scale.

DESCRIPTION OF THE PREFERRED EMBODIMENTS

Figure 1:
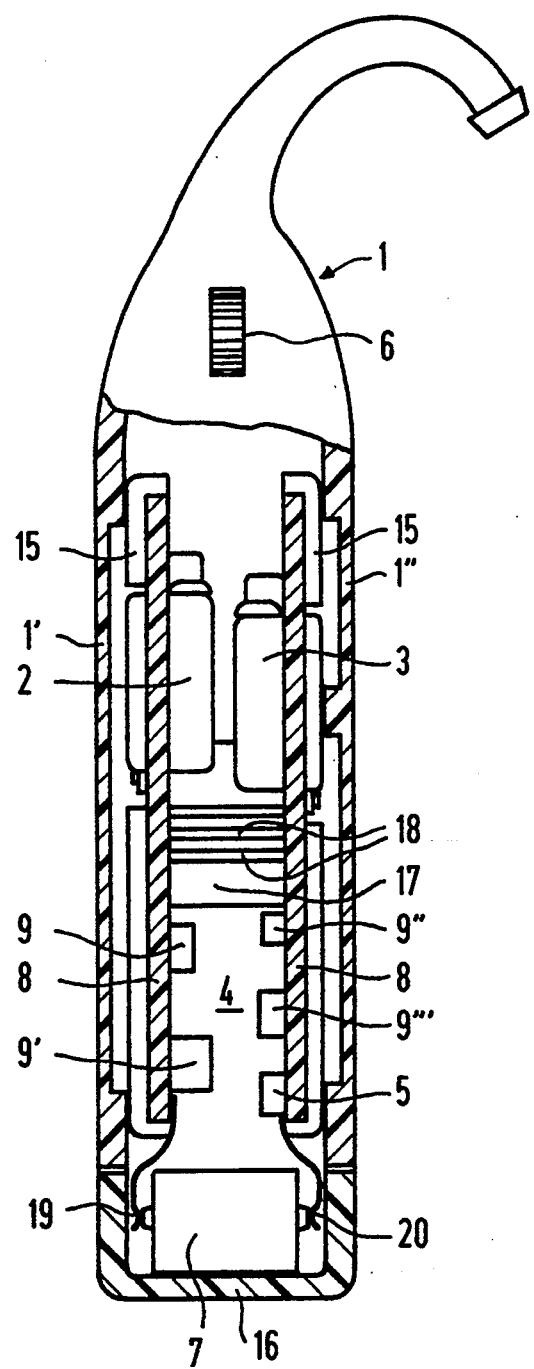
FIG. 1 shows a sectional, schematic view of the housing 1 composed of two shells 1', 1" for a BTE hearing aid, whereby only an amplifier unit 4 having two printed circuit boards as carrier part 8 is shown in the housing, this being supported against the insides of the housing shells point-by-point or section-by-section upon interposition of a damping material 15.

The hearing aid shown in FIG. 1 comprises a housing I that is composed of two housing shells 1', 1". In the BTE hearing aid schematically shown as an exemplary embodiment, a space for the acceptance of a power source/battery 7 that is accessible via a pivotable housing part 16 (battery compartment) is situated in the lower region of the housing. 6 indicates an actuation element, for example a volume control.

An amplifier unit 4 composed of a carrier part 8 of, for example, two printed circuits/reinforcing boards that are connected to one another by a flexible zone 17, is also situated in the housing 1. The printed circuit boards are equipped with electrical components 9, 9', 9", 9''' such as resistors, capacitors, chips and, potentially, with control elements 5. According to the illustrated exemplary embodiment, further input and output transducers 2 and 3 are attached directly on the carrier part 8. For example, the input transducer (microphone) 2 is thereby seated at the one printed circuit board and the output transducer (earphone) 3 is seated at the second board, and the two sound transducers have their electrical terminals contactable, for example, directly to interconnects of the printed circuit board. The interconnects of the amplifier unit 4 are joined to form an amplifier circuit by flexible interconnect sections 18 conducted over the flexible zone 17. The amplifier unit 4 can be connected via spring contacts 19, 20 to the power source 7 for supplying the amplifier circuit and the sound transducers with power.

Figure 2:
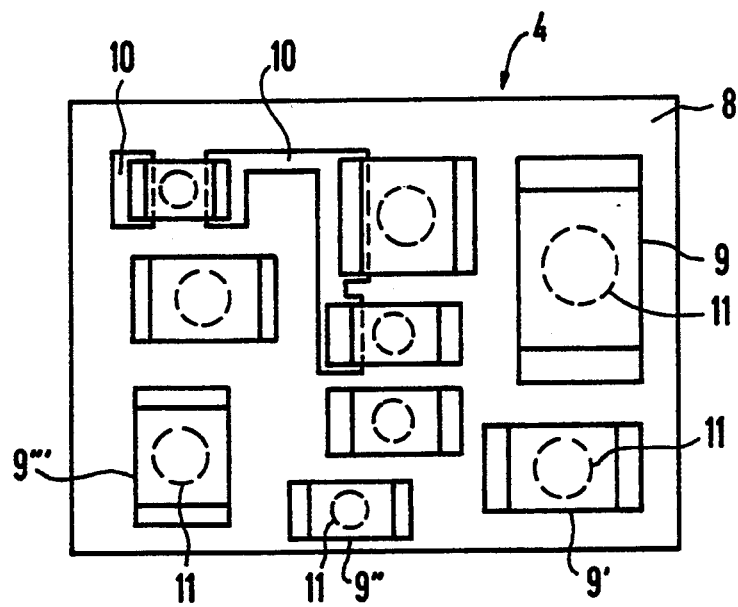
FIG. 2 shows a plan view onto the upper side of a carrier part 8 composed of a printed circuit board that is equipped with electrical components 9, 9', 9", 9''' (for example, resistors, capacitors, chip modules or the like).

According to FIG. 2, the carrier part 8 of the amplifier unit 4, said carrier part being composed of a printed circuit board, is equipped with electrical components 9, 9', 9", 9''' whose copper pads or electrical terminals 21, 22 are in electrically conductive communication with the contact locations 10 of the printed circuit board. According to the invention, the components are pressed against the contact locations in a mechanical hold and are simultaneously held in the equipping/contacting position. For that purpose, a highly shrinkable glue 11/quick-set glue or seconds-setting glue is applied onto the carrier part at, for example, the locations indicated with broken lines, this highly shrinkable glue 11 fixing the electrical component after the equipping and, as a consequence of the shrink process, pulling it into the contacting position against the contact locations and holding it in this tightened position without soldering or heating as shown in FIG. 3.

Figure 3:
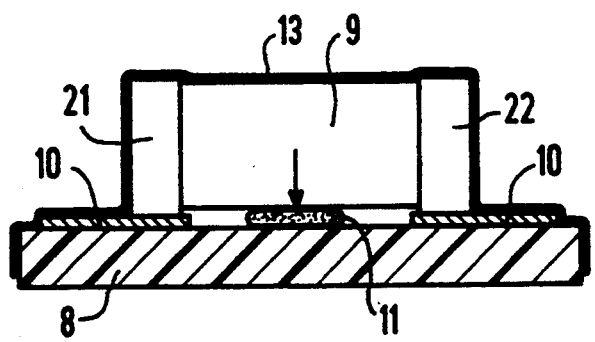
FIG. 3 shows a section through an electrical component 9 arranged at the carrier part 8 in accordance with the invention.

The contacting position between the Cu pads 21, 22 of the chip component 9 and the contact locations/interconnects 10 of the printed circuit board 8 derive from FIG. 3. The holding and tightening force of the shrinkable glue 11 is indicated by an arrow. In this embodiment, further, the carrier part 8 equipped with the components 9 is coated with a protective coat 13 of insulating material, for example a polyurethane lacquer.

Figure 4:
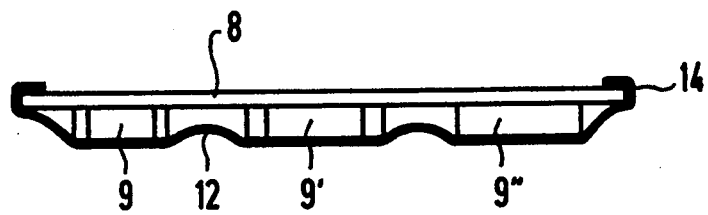
FIGS. 4 and 5 show another embodiment of the invention wherein the electrical components 9 arranged at a carrier part/printed circuit board 8 are fixed against the contact locations 10 of the printed circuit board and held in contacting position by a film 12, whereby the film simultaneously forms an insulating protective envelope.
Figure 5:
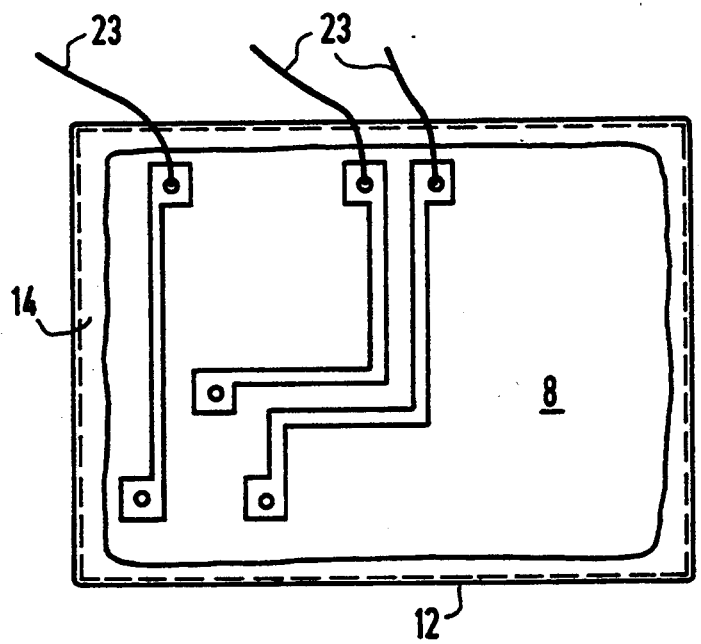

In the embodiment of FIGS. 4, 5, the electrical components 9, 9', 9" are held in contacting position against the contact locations of the carrier part 8 with a film 12. The film 12, a film tube or a film tube section composed of polyvinyl chloride, silicone rubber, polytetrafluoroethylene or the like, all of which are formed of a flexible film sheet is applied onto the carrier part equipped with the components and is then suctioned against the carrier part by applying an under-pressure, so that the film presses the components against the allocated contact locations with adequate contacting and holding force on the one hand and, on the other hand, contracts into gaps between the components. Consequently, the film simultaneously forms a protective sheath as well as an insulation between the electrical components.

In an advantageous embodiment, the film 12 or the like has its edge region 14 bonded, glued or secured in a similar way to the carrier part 8, particularly a printed circuit board. 23 indicates stranded conductors for the connection of the amplifier unit 4 to further electrical hearing aid components.

An advantageous development of the invention is comprised therein that a film 12 or the like is arranged on the carrier part 8 equipped and contacted by the components 9 on the basis of the glue 11, and is pulled against the carrier part by applying an under-pressure such that the film fixes the components at the provided locations, holds them against the contact locations 10 with the assistance of the glue contacting pressure, and without soldering or heating and forms an insulating protective sheath for the equipped carrier part. An especially protected amplifier unit is obtained in this embodiment. A silicone glue can be particularly employed as the highly shrinkable glue.

In a modified embodiment that is not shown, it is possible that a plastic part having electrical connections or a section of the hearing aid housing (section of the inside housing wall) having integrated conductors, or interconnects or conductors, or interconnects applied on the surface, forms the carrier part.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

We claim as our invention:

1. A miniature hearing aid to be worn at the head, comprising:
   a housing;
   sound transducers, an amplifier unit, at least one control element, and a power source in the housing;
   the amplifier unit comprising a carrier part and electrical components on the carrier part, said carrier part having contact locations arranged to make contact with the electrical components; and
   a highly shrinkable glue means for mechanically pressing at least one of the components against corresponding solderless contact locations for the component to insure direct electrical contact without any soldering or heating, said glue means being provided only between non-contact portions of the component and the carrier part, and no solder being provided between the component and the contact location for the component.

2. A hearing aid according to claim 1 wherein a plurality of components are mechanically pressed against corresponding contact locations of the carrier part by the highly shrinkable glue means.

3. A hearing aid according to claim 1 wherein the carrier part comprises a printed circuit board having contact locations and printed conductors connecting to the contact locations.

4. A hearing aid according to claim 1 wherein said glue means comprises a silicon glue.

5. A hearing aid according to claim 1 wherein said glue means comprises a seconds-set glue.

6. A hearing aid according to claim 1 wherein said carrier part comprises a printed circuit board.

7. A method for manufacturing a hearing aid, comprising steps of:
   providing a housing;
   providing sound transducers, an amplifier unit, at least one control element, and a power source in the housing;
   providing the amplifier unit as a carrier part with electrical components thereon; and
   mounting in solderless fashion and without heat at least one of the components on to the carrier part by applying a highly shrinkable glue on to at least one of the carrier part at a desired contacting location for the at least one component or onto the component, and then placing the component onto the carrier part so that the highly shrinkable glue, as it dries, pulls the component against the desired contacting location for direct contacting as well as for being held there by the shrinkable glue without soldering or heating, Said highly shrinkable glue being positioned only at non-contact portions of the component when the component is on the carrier part.

8. A method according to claim 7 wherein the highly shrinkable glue is applied in spot fashion.

9. A method according to claim 7 wherein the highly shrinkable glue is applied in line fashion.

10. A method according to claim 7 wherein the highly shrinkable glue is applied in area-wise fashion with respect to an area of the component overlying the carrier part.

11. A method according to claim 7 wherein the highly shrinkable glue is applied onto the carrier part.

12. A method according to claim 7 including applying an insulating material coating over the at least one component held on the carrier part by the shrinkable glue.

13. A method according to claim 7 wherein the highly shrinkable glue comprises a silicon glue.

14. A method according to claim 7 wherein the shrinkable glue comprises a seconds-set glue.

15. A miniature hearing aid to be worn at the head, comprising:
   a miniature hearing aid to be worn at the head, comprising:
   a housing;
   sound transducers, an amplifier unit, at least one control element, and a power source in the housing;
   said amplifier unit comprising a carrier part with electrical components thereon; and
   a film means formed of a flexible film sheet for mechanically pressing at least one of the electrical components directly against corresponding contact locations on the carrier part and for also fixing the component in position without soldering or heating, no solder being provided between the electrical components and the contact locations.

16. A hearing aid according to claim 15 wherein said film means comprises a film tube.

17. A hearing aid according to claim 15 wherein the film means comprises a film tubular section.

18. A hearing aid according to claim 15 wherein a plurality of the components on the carrier part are pressed against their corresponding contacting locations by the film means.

19. A hearing aid according to claim 15 wherein said film means has edges which wrap around an edge region of the carrier part.

20. A hearing aid according to claim 15 wherein the carrier part comprises a pc board having contact locations at a surface thereof and printed conductors connected to the contact locations.

21. A hearing aid according to claim 15 wherein a glue is provided between the component and the carrier part only at non-contact portions of the component.

22. A method for manufacturing a hearing aid, comprising the steps of:
   providing a housing;
   providing sound transducers, an amplifier unit, at least one control element, and a power source in the housing;
   providing the amplifier unit as a carrier part with electrical components thereon; and
   mounting at least one of the components on the carrier part by use of a film formed of a flexible film sheet which is placed over the component and which also engages with at least a portion of the carrier part for pressing the component directly against corresponding contact locations for the respective component and for holding the component on the carrier part without soldering or heating.

23. A method according to claim 22 including the steps of placing the film over the carrier part and pulling the component against the carrier part by applying an under-pressure to pull the film on to the component to press the component against the corresponding contact locations with a desired contacting pressure.

24. A method according to claim 23 wherein the film comprises a film tube.

25. A method according to claim 23 wherein the film comprises a film tube section.

26. A method according to claim 22 including the further steps of applying a glue between the component only at non-contact portions of the component and the carrier part, and then pulling the component towards the carrier part so that it is in secure contact with the corresponding contact locations by applying an under-pressure to the film to pull the film against the component and to press the component against the carrier part.

* * * * *